une(12) United States Patent
Huang et al.

(10) Patent No.: US 11,026,342 B2
(45) Date of Patent: Jun. 1, 2021

(54) CAGE ASSEMBLY FOR EXPANSION MODULE AND ELECTRONIC DEVICE

(71) Applicant: Wistron Corp., New Taipei (TW)

(72) Inventors: Wen Huang, New Taipei (TW); Zhi-Tao Yu, New Taipei (TW); Bo-Chun Lin, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/729,636

(22) Filed: Dec. 30, 2019

(65) Prior Publication Data

US 2021/0045261 A1 Feb. 11, 2021

(30) Foreign Application Priority Data

Aug. 8, 2019 (CN) .......................... 201910730590.6

(51) Int. Cl.
*H05K 7/20* (2006.01)
*H05K 7/14* (2006.01)

(52) U.S. Cl.
CPC .................................. *H05K 7/1489* (2013.01)

(58) Field of Classification Search
CPC ............................ H05K 7/1488; H05K 7/1489
See application file for complete search history.

(56) References Cited

U.S. PATENT DOCUMENTS

| 6,171,120 | B1 * | 1/2001 | Bolich | H01R 13/62933 |
| | | | | 361/679.4 |
| 6,580,603 | B1 * | 6/2003 | Resnick | G06F 1/184 |
| | | | | 312/223.1 |
| 6,953,232 | B2 * | 10/2005 | Busby | A47B 81/06 |
| | | | | 292/196 |
| 7,344,394 | B1 * | 3/2008 | Barina | G06F 1/183 |
| | | | | 361/755 |
| 8,498,120 | B2 * | 7/2013 | Chen | H05K 5/023 |
| | | | | 361/726 |
| 10,045,458 | B2 * | 8/2018 | Yu | H05K 7/1487 |
| 10,212,840 | B2 * | 2/2019 | Kuan | H05K 7/1487 |
| 10,251,300 | B1 * | 4/2019 | Mao | H05K 7/1489 |

(Continued)

FOREIGN PATENT DOCUMENTS

TW 201141357 A 11/2011

OTHER PUBLICATIONS

Taiwan Patent Office, "Office Action", dated Mar. 31, 2020.

*Primary Examiner* — Anthony Q Edwards
(74) *Attorney, Agent, or Firm* — Locke Lord LLP; Tim Tingkang Xia, Esq.

(57) ABSTRACT

The disclosure relates to an electronic device including a chassis, a mainboard, a tray, a positioning component, and a cage assembly. The mainboard is disposed on the chassis. The tray is disposed on the chassis and located above the mainboard. The positioning component is fixed to the mainboard. The cage assembly includes a cage and a linkage assembly. The cage has a contact portion. The contact portion is disposed on the tray. The linkage assembly, includes an actuating lever and latch. The actuating lever is movably disposed on the cage. The actuating lever and the contact portion are respectively located at two opposite sides of the cage. The latch is connected to the actuating lever and has an engaging portion. The engaging portion is engageable with the positioning component.

14 Claims, 11 Drawing Sheets

(56) References Cited

U.S. PATENT DOCUMENTS

| | | | |
|---|---|---|---|
| 2008/0074837 A1* | 3/2008 | Denny | H05K 7/1409 |
| | | | 361/679.33 |
| 2014/0022721 A1* | 1/2014 | Wang | H05K 7/14 |
| | | | 361/679.32 |
| 2019/0294219 A1* | 9/2019 | Tsorng | G06F 1/185 |

* cited by examiner

CAGE ASSEMBLY FOR EXPANSION MODULE AND ELECTRONIC DEVICE

CROSS-REFERENCE TO RELATED APPLICATIONS

This non-provisional application claims priority under 35 U.S.C. § 119(a) on Patent Application No(s). 201910730590.6 filed in China on Aug. 8, 2019, the entire contents of which are hereby incorporated by reference.

TECHNICAL FIELD

The disclosure relates to a cage assembly and an electronic device, more particularly to a cage assembly having a linkage assembly and an electronic device having the same.

BACKGROUND

In recent years, gaming, language processing, finance, medical biology, search engines, e-commerce, social media, and other industries have experienced explosive growth of development and application in various fields, such as deep learning and artificial intelligence, thus creating the need to process a huge amount of data.

Graphic processing unit (GPU) is designed for processing repetitive and highly-parallel computing tasks, thus GPU is optimized to do very specific computational tasks and GPU is more efficient and suitable for large-scale mathematical operations and dealing with complex problems than Central Processing Unit (CPU) when it comes to processing tasks that require multiple parallel processes, thereby accelerating the development of deep learning and artificial intelligence.

In response to the urgent market requirement for GPUs, more and more servers are designed to be able to be equipped with GPU module. Conventionally, the GPU module is connected to the slot of the mainboard of the server via gold fingers of its adapter card. The GPU module usually has a pivotable handle, one end of the handle is pivotally connected to the GPU module, and the other end of the handle is fixed to a middle tray on which the GPU module is placed, such that the GPU module can be fixed in position on the middle tray.

However, the middle tray is just a partition placed above the mainboard for dividing the internal space of the server. Any external force applied on the server would easily cause the middle tray to vibrate and move vertically, thereby causing the GPU module to move vertically to disengage its gold fingers from the slot of the mainboard.

Such an issue will become more serious when the GPU module contains more amount of GPUs, because the GPUs increase the overall weight of the GPU module so as to increase the inertia of the GPU module that increases as the movement of the middle tray; therefore, it becomes much easier to cause the gold fingers to disconnect from the slot.

It can be understood that, from the abovementioned level of the prior art, the forgoing issue does not only occur at the GPU module on the server but also occur at other functional modules or function expansion assemblies on any other electronic devices.

SUMMARY

One embodiment of the disclosure provides an electronic device including a chassis, a mainboard, a tray, a positioning component, and a cage assembly. The mainboard is disposed on the chassis. The tray is disposed on the chassis and located above the mainboard. The positioning component is fixed to the mainboard. The cage assembly includes a cage and a linkage assembly. The cage has a contact portion. The contact portion is disposed on the tray. The linkage assembly includes an actuating lever and latch. The actuating lever is movably disposed on the cage. The actuating lever and the contact portion are respectively located at two opposite sides of the cage. The latch is connected to the actuating lever and has an engaging portion. The engaging portion is engageable with the positioning component.

Another embodiment of the disclosure provides a cage assembly including a cage and a linkage assembly. The cage has a contact portion. The linkage assembly includes an actuating lever and a latch. The actuating lever is movably disposed on the cage. The actuating lever and the contact portion are respectively located at two opposite sides of the cage. The latch is connected to the actuating lever and has an engaging portion. The engaging portion is engageable with a positioning component.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
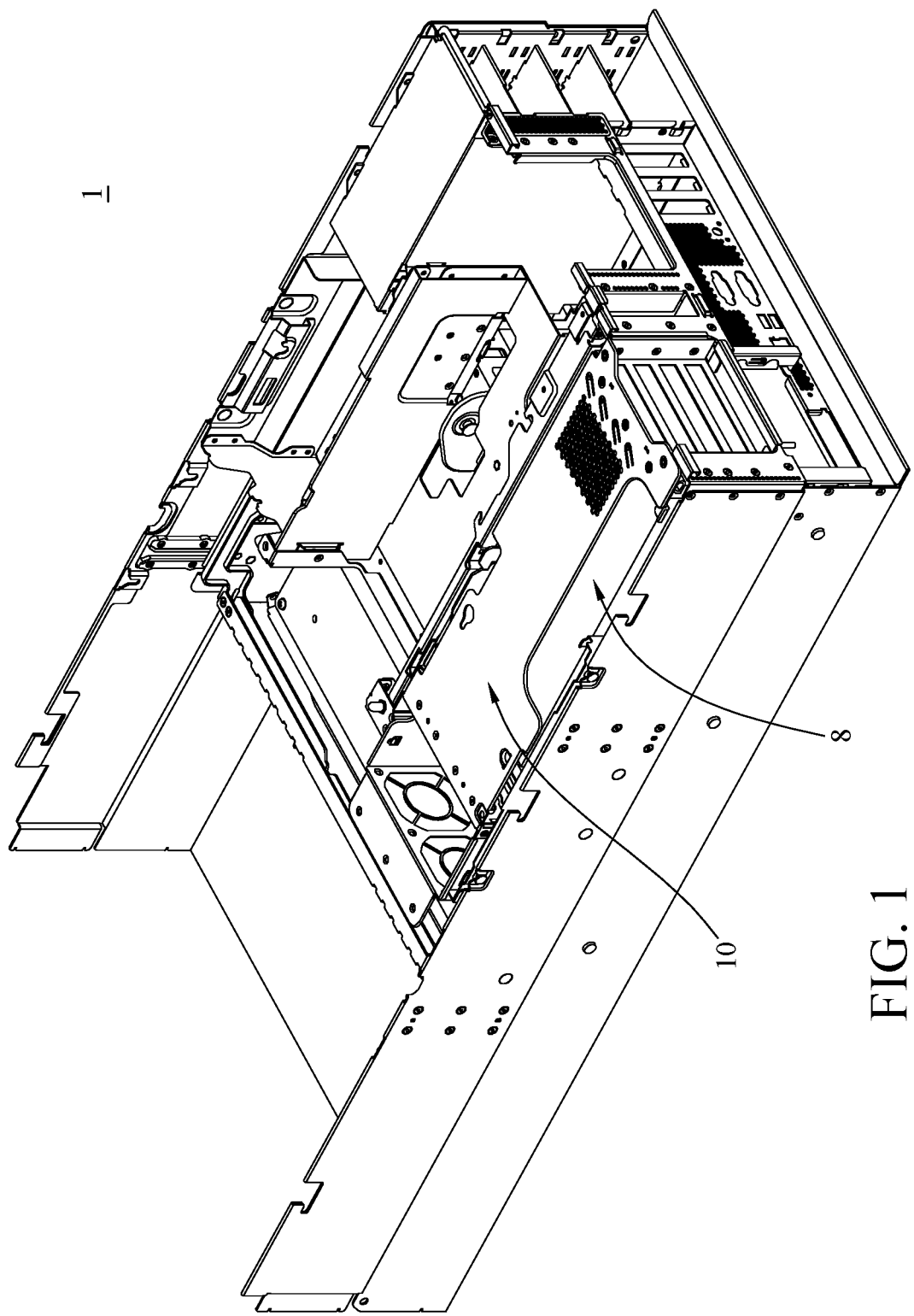
FIG. 1 is a perspective view of an electronic device according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details.

In addition, for the purpose of simple illustration, well-known structures and devices are drawn schematically, and some components or unnecessary details may be omitted from the drawings. And the size or ratio of the features in the drawings of the present disclosure may be exaggerated for illustrative purposes, but the present disclosure is not limited thereto. Note that the actual size and designs of the product manufactured based on teaching and suggestion of the present disclosure may also be properly modified according to any actual requirement. Furthermore, for ease of understanding, a coordinate system is provided in the drawings, but the disclosure is not limited by the coordinate system.

In addition, terms, such as "end", "part", "portion" or "area" may be used in the following to describe specific element and structure or specific technical feature on or between them, but these elements, structure and technical feature are not limited by these terms. Also, in the following, it may use terms, such as "substantially", "approximately" or "about"; when these terms are used in combination with size, concentration, temperature or other physical or chemical properties or characteristics, they are used to express that, the deviation existing in the upper and/or lower limits of the range of these properties or characteristics or the acceptable tolerances caused by the manufacturing tolerances or analysis process, would still able to achieve the desired effect.

In addition, terms, such as "connected", "disposed" or "assembled" are used to indicate the relationship between two features. Unless specifically defined, the use of these terms does not only indicate that one feature is directly "connected", "disposed", or "assembled" to another feature.

Furthermore, unless otherwise defined, all the terms used in the disclosure, including technical and scientific terms, have their ordinary meanings that can be understood by those skilled in the art. Moreover, the definitions of the above terms are to be interpreted as being consistent with the technical fields related to the disclosure. Unless specifically defined, these terms are not to be construed as too idealistic or formal meanings.

Figure 2:
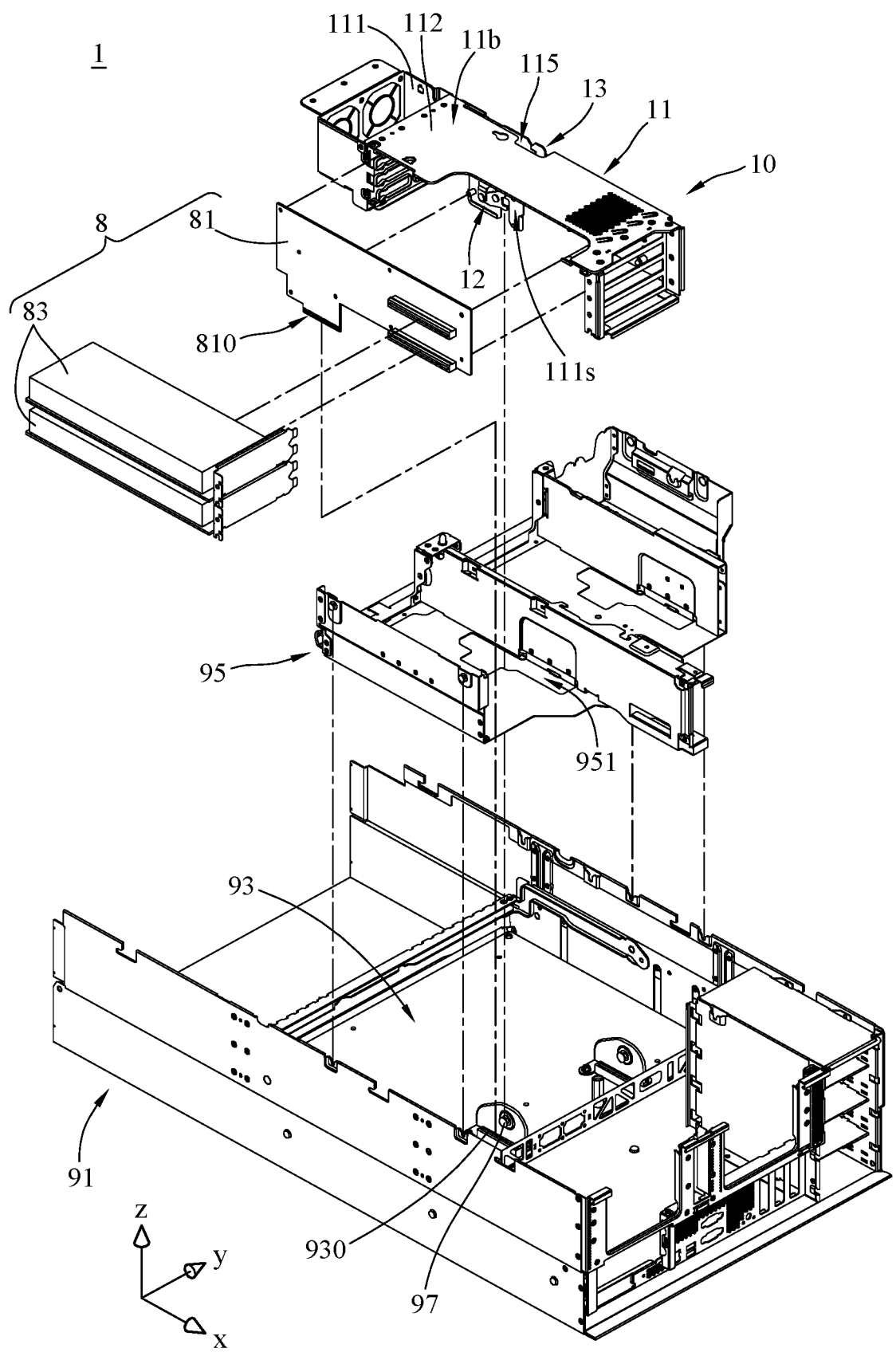
FIG. 2 is an exploded view of the electronic device in FIG. 1.
Figure 3:
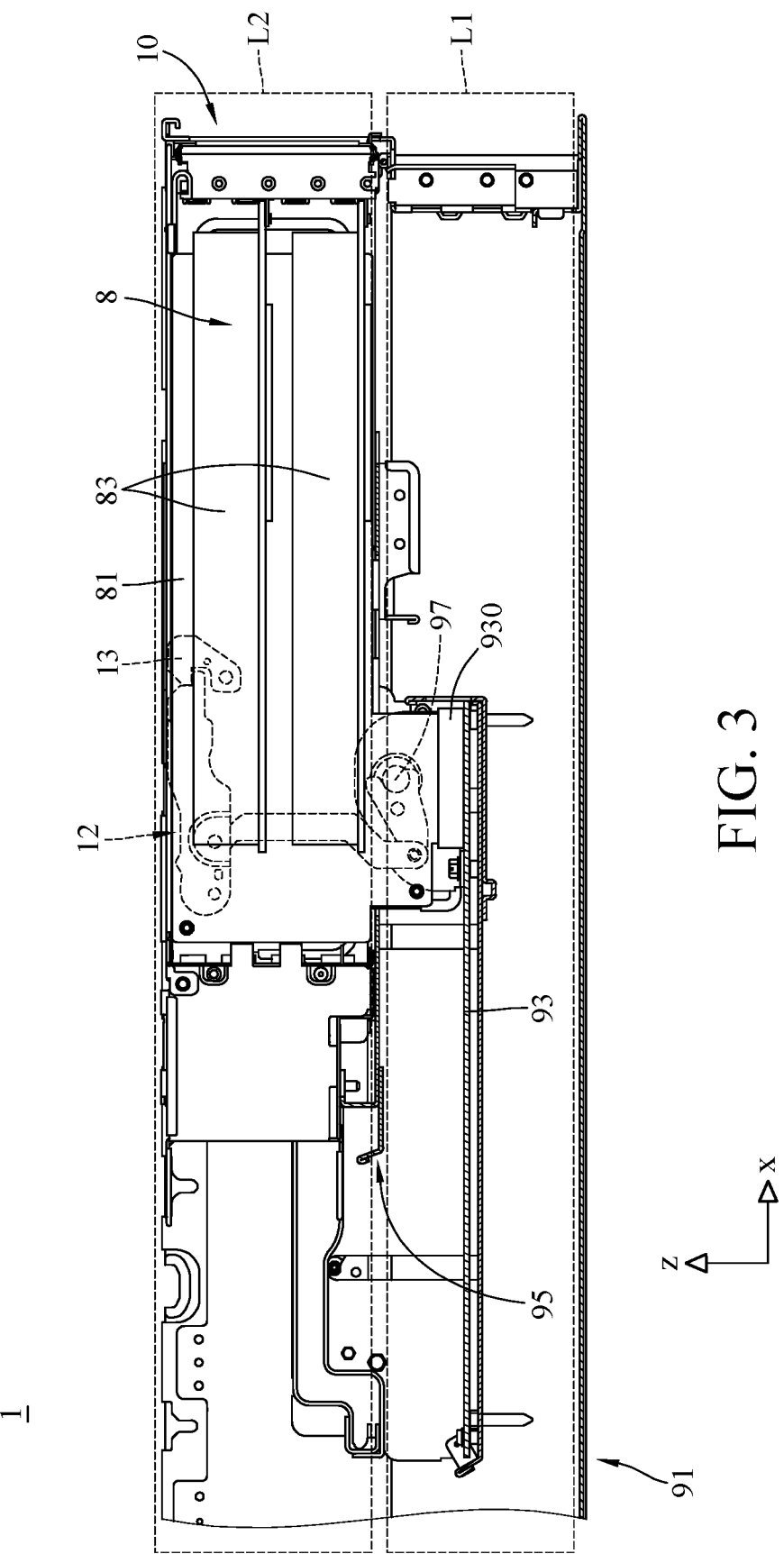
FIG. 3 is a cross sectional side view of the electronic device in FIG. 1.

Firstly, referring to FIG. 1-3, this embodiment provides a cage assembly 10 for an electronic device 1, where FIG. 1 is a perspective view of an electronic device 1 according to one embodiment of the disclosure, FIG. 2 is an exploded view of the electronic device 1 in FIG. 1, and FIG. 3 is a cross sectional side view of the electronic device 1 in FIG. 1. In addition, for the purpose of simple illustration, some components or unnecessary details on the electronic device 1, such as fan and cables, were simplified or omitted from the drawings.

The electronic device 1 is, for example, but not limited to a server host, but the form of the electronic device 1 is merely an exemplary embodiment to illustrate the spirit of the disclosure and the electronic device 1 is not limited to the type of the server shown in the drawings. And the disclosure is not limited to be applicable to the field of server; for example, in some other embodiments, the electronic device of the disclosure may be another type of server or computer host.

The cage assembly 10 is arranged in a detachable manner and is configured to accommodate an electronic device required by the electronic device 1, where the electronic device may be a function expansion assembly 8 detachably installed on the electronic device 1. The function expansion assembly 8 is able to provide required function to the electronic device 1.

In the case that the electronic device 1 is a server, the cage assembly 10 is configured to accommodate one or more than two function expansion assemblies 8, but the disclosure is not limited thereto. For the purpose of simple illustration, the drawings only show one function expansion assembly 8. The function expansion assembly 8 is, for example, a graphic processing unit (GPU) module. As shown in FIG. 2, in this embodiment, the function expansion assembly 8 includes, for example, an adapter card 81 fixed on the cage assembly 10 and one or more GPUs 83 connected to the adapter card 81, wherein the adapter card 81 has gold fingers 810.

Note that the type and size of the function expansion assembly that can be accommodated in the cage assembly of the disclosure is not particularly restricted, and the quantity and type of the function-expansion unit (e.g., the GPUs 83) that can be disposed on the function expansion assembly is either not restricted and can be changed according to actual requirements. For example, in some other embodiments, the function expansion assembly may be a battery module or hard disk drive module. In addition, the disclosure is not limited to the connection between the cage assembly 10 and the function expansion assembly 8 and the means, such as screws, for fixing the function expansion assembly 8 are omitted from the drawings.

In more detail, as shown in FIG. 2, in this embodiment or some other embodiments, the electronic device 1 includes a chassis 91, a mainboard 93, and a tray 95. The mainboard 93 is fixed on the chassis 91, but the disclosure is not limited by how the mainboard 93 is fixed in position and the function expansion assembly (not shown) that can be arranged on the mainboard 93. The tray 95 is detachably disposed on the chassis 91 and is located above the mainboard 93, but the disclosure is not limited by the configuration of the tray 95 and how the tray 95 is fixed in position. In this embodiment and some other embodiments, the cage assembly 10 is removably disposed on the tray 95.

Further, in this embodiment and some other embodiments, at least one edge connector 930 for connecting the gold fingers 810 of the function expansion assembly 8 and at least one positioning component 97 for engaging with the cage assembly 10 are arranged on the surface of the mainboard 93 facing the tray 95. As shown in FIG. 2, the positioning component 97 is located adjacent to the edge connector 930, but the disclosure is not limited thereto. As long as that the positioning component 97 is not allowed to be moved relative to the mainboard 93 (i.e., as long as that the connection between the positioning component 97 and the mainboard 93 is secured and not affected by external force), the positioning component 97 may be not located on the mainboard 93; for example, in some other embodiments, the positioning component 97 may be fixed at any proper position on the chassis 91, and the positioning component 97 may be fixed in position relative to the mainboard 93 via the chassis 91. In addition, the disclosure is not limited to the type of the edge connector 930, and any other types of connector that are suitable for connecting to the function expansion assembly in the cage assembly may be employed. Further, the disclosure is not limited to the design of the positioning component 97, and any other types of pin that are suitable for engaging with the cage assembly may be employed.

When the cage assembly 10 is installed on the tray 95 and arranged to its predetermined position, the gold fingers 810 of the function expansion assembly 8 on the cage assembly 10 can be connected to the edge connector 930 on the mainboard 93, and the cage assembly 10 can be engaged with the positioning component 97 on the mainboard 93 so as to secure the position of the function expansion assembly 8 relative to the mainboard 93 and thus ensuring the electrical connection between the gold fingers 810 and the edge connector 930. The detail of how the cage assembly 10 is engaged with the positioning component 97 will be described in the later paragraphs.

In addition, in the cross sectional side view of the electronic device 1 shown in FIG. 3, the tray 95 substantially divides the internal space of the chassis 91 into a lower area L1 and an upper area L2. The lower area L1 indicates the space between the tray 95 and the chassis 91, and the upper area L2 indicates the space located at a side of the tray 95 facing away from the chassis 91. Therefore, to the electronic device 1, the tray 95 can be considered as a middle tray, but the disclosure is not limited to the ratio between the lower area L1 and the upper area L2. In FIG. 3, in this embodiment or some other embodiments, the mainboard 93 and the edge connector 930 and the positioning component 97 disposed thereon are substantially located in the lower area L1; that is, the edge connector 930 and the positioning component 97 are substantially located between the mainboard 93 and the tray 95; and most part of the cage assembly 10 and the function expansion assembly 8 disposed thereon are substantially located in the upper area L2. As such, in this embodiment or some other embodiments, the relative position between the function expansion assembly 8 in the upper area L2 and the edge connector 930 in the lower area L1 can be secured by engaging the cage assembly 10 to the positioning component 97.

Figure 4:
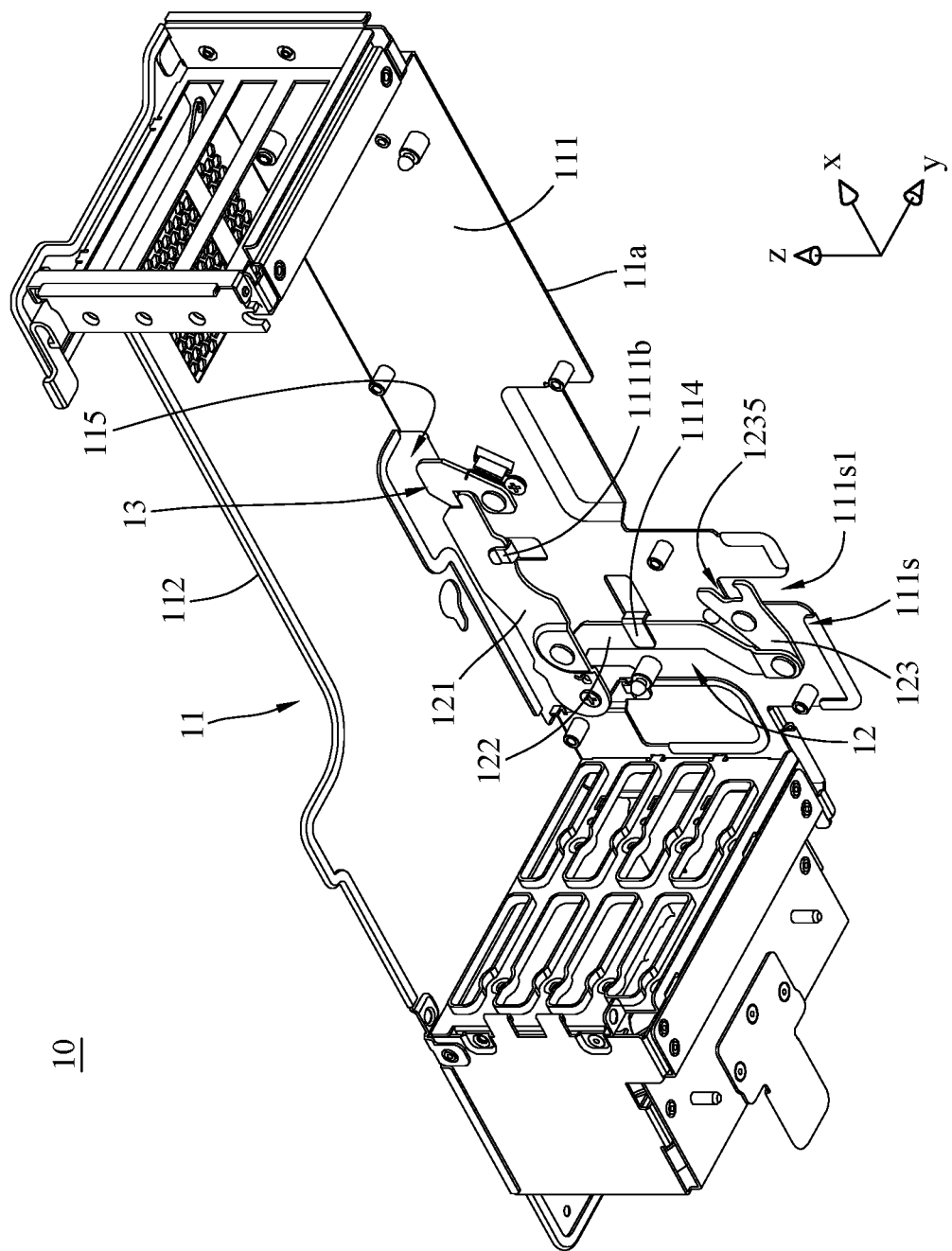
FIG. 4 is a perspective view of a cage assembly in FIG. 1.
Figure 5:
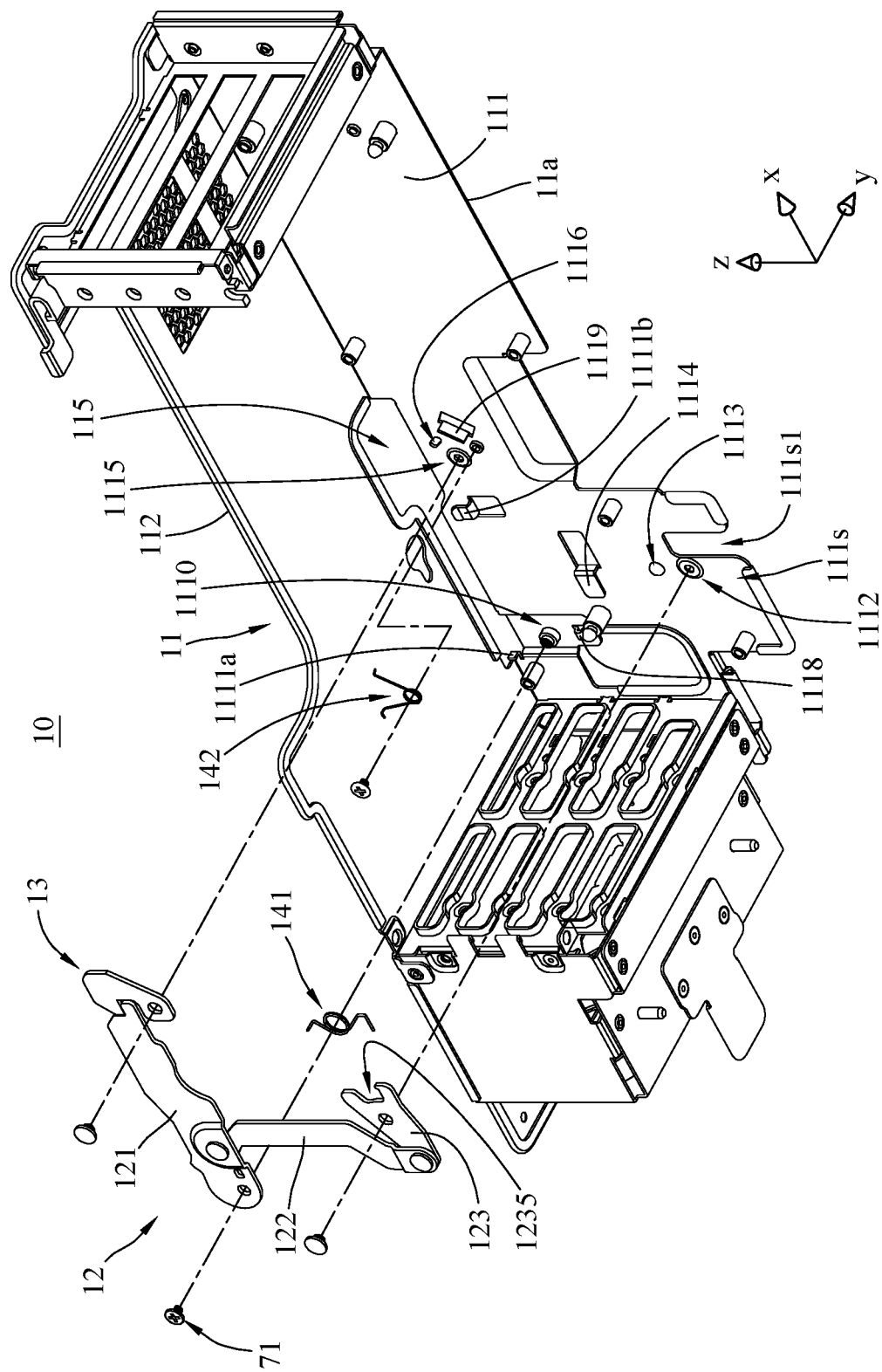
FIG. 5 is an exploded view of the cage assembly in FIG. 4.
Figure 7:
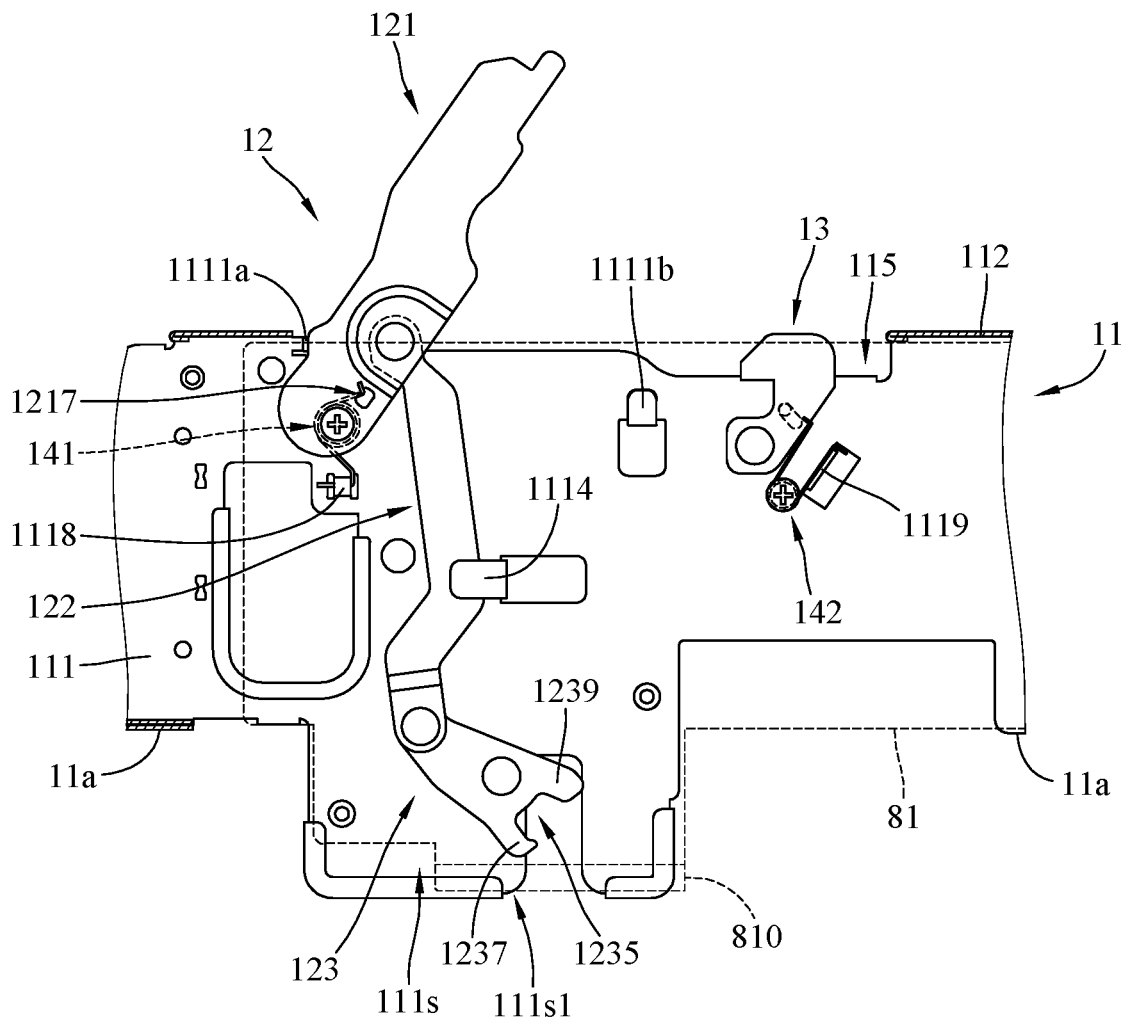
FIGS. 7-12 illustrate the installation processes of the cage assembly in FIG. 1.
Figure 12:
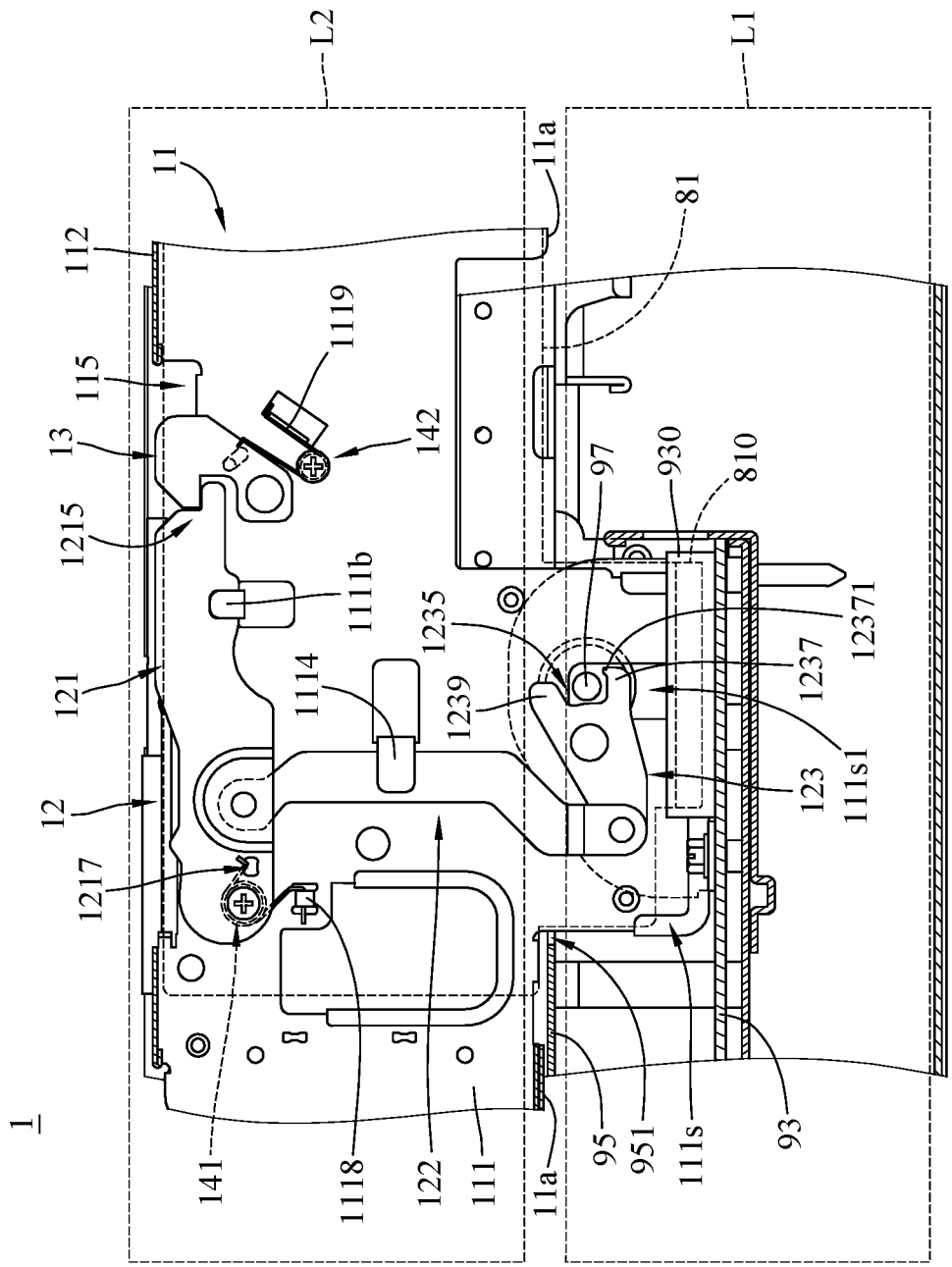

Then, the detail of the cage assembly 10 is described hereinafter. Referring to FIGS. 4-5, FIG. 4 is a perspective view of the cage assembly 10 in FIG. 1, and FIG. 5 is an exploded view of the cage assembly 10 in FIG. 4. In this embodiment, the cage assembly 10 includes a cage 11 and a linkage assembly 12. The cage 11 has a contact portion 11a and a top surface 11b (as shown in FIG. 2). The contact portion 11a and the top surface 11b face different directions. The contact portion 11a indicates the part, surface or edge of the cage 11 that can be placed on or abutting the tray 95 so as to bear the weight of the cage assembly 10 when the cage assembly 10 is disposed on the tray 95, but the disclosure is not limited to the size and shape of the contact portion 11a. The top surface 11b is the surface of the cage 11 facing outward and exposed to outside or facing away from the tray 95. The linkage assembly 12 is movably disposed on the cage 11 and has a detached status (as shown in FIG. 7 illustrated in later paragraphs) and an installed status (as shown in FIG. 2 or FIG. 12 illustrated in later paragraphs). In addition, referring back to the structural relationship shown in FIG. 2, the linkage assembly 12 is located between the cage 11 and the adapter card 81.

In addition, in this embodiment or some other embodiments, the linkage assembly 12 has an engaging portion 1235. As shown in FIG. 4, the engaging portion 1235 is protruding from the side of the cage 11 having the contact portion 11a. When the contact portion 11a of the cage 11 is placed on the tray 95, the engaging portion 1235 can be engaged with the positioning component 97 on the mainboard 93 by switching the linkage assembly 12 to the installed status. By doing so, the cage assembly 10 can be assembled on the mainboard 93, such that the function expansion assembly 8 can be firmly electrically connected to the edge connector 930. On the other hand, the engaging portion 1235 can be disengaged from the positioning component 97 by switching the linkage assembly 12 to the detached status, allowing the cage assembly 10 and the function expansion assembly 8 thereon to be removed from the mainboard 93. The detail operations will be described in the later paragraphs.

In this embodiment, the cage 11 is, for example, made of a single piece. The cage 11 may include a first plate part 111 and a second plate part 112. The first plate part 111 is connected to a side of the second plate part 112. In other words, the second plate part 112 is connected to a side of the first plate part 111. The first plate part 111 and the second plate part 112 are substantially perpendicular to each other. In FIG. 4, the first plate part 111 and the second plate part 112 together form a space (not labeled) for accommodating the function expansion assembly 8, but the disclosure is not limited to the size and shape of the space defined by the first plate part and second plate part. The aforementioned contact portion 11a is located at an edge of the first plate part 111 located away from the second plate part 112, thus, the edge of the first plate part 111 located away from the second plate part 112 can be considered as part or whole of the contact portion 11a of the cage 11. When the cage assembly 10 rests on the tray 95, the first plate part 111 is abutting the tray 95 via the contact portion 11a.

In addition, in this embodiment, the cage 11 has a through slot 115, and the through slot 115 is located between the first plate part 111 and the second plate part 112. The linkage assembly 12 is detachably disposed on an inner sidewall (not labeled) of the first plate part 111, and part of the linkage assembly 12 is movably located at the through slot 115 so that at least part of the linkage assembly 12 is able to be moved out of the space between the first plate part 111 and the second plate part 112. In addition, the disclosure is not limited to the cage 11 shown in the drawings; for example, in some other embodiments, the second plate part 112 may be omitted from the cage of the cage assembly.

Further, in this embodiment, the cage 11 further has a guide portion 111s, the guide portion 111s is located on the first plate part 111 and protrudes from the contact portion 11a, and the guide portion 111s has a guide slot 111s1. During the movement that the cage assembly 10 is placed on the tray 95, the guide portion 111s passes through the through hole 951 of the tray 95, and the positioning component 97 on the mainboard 93 enters into and slides along the guide slot 111s1. Therefore, the guide portion 111s and the guide slot 111s1 help to guide the cage assembly 10 to the desired position.

In addition, in this embodiment or some other embodiments, the cage 11 may further comprise other plate features (not labeled) connected to the first plate part 111 and/or the second plate part 112 for accommodating one or more fans (not shown), covering the internal components, increasing the structural strength or for the cage 11 to be disposed on the chassis 91, but the disclosure is not limited thereto. In some other embodiments, the configuration of the cage can be modified or changed depending on the size or quantity of the function expansion assembly accommodated therein.

Figure 6:
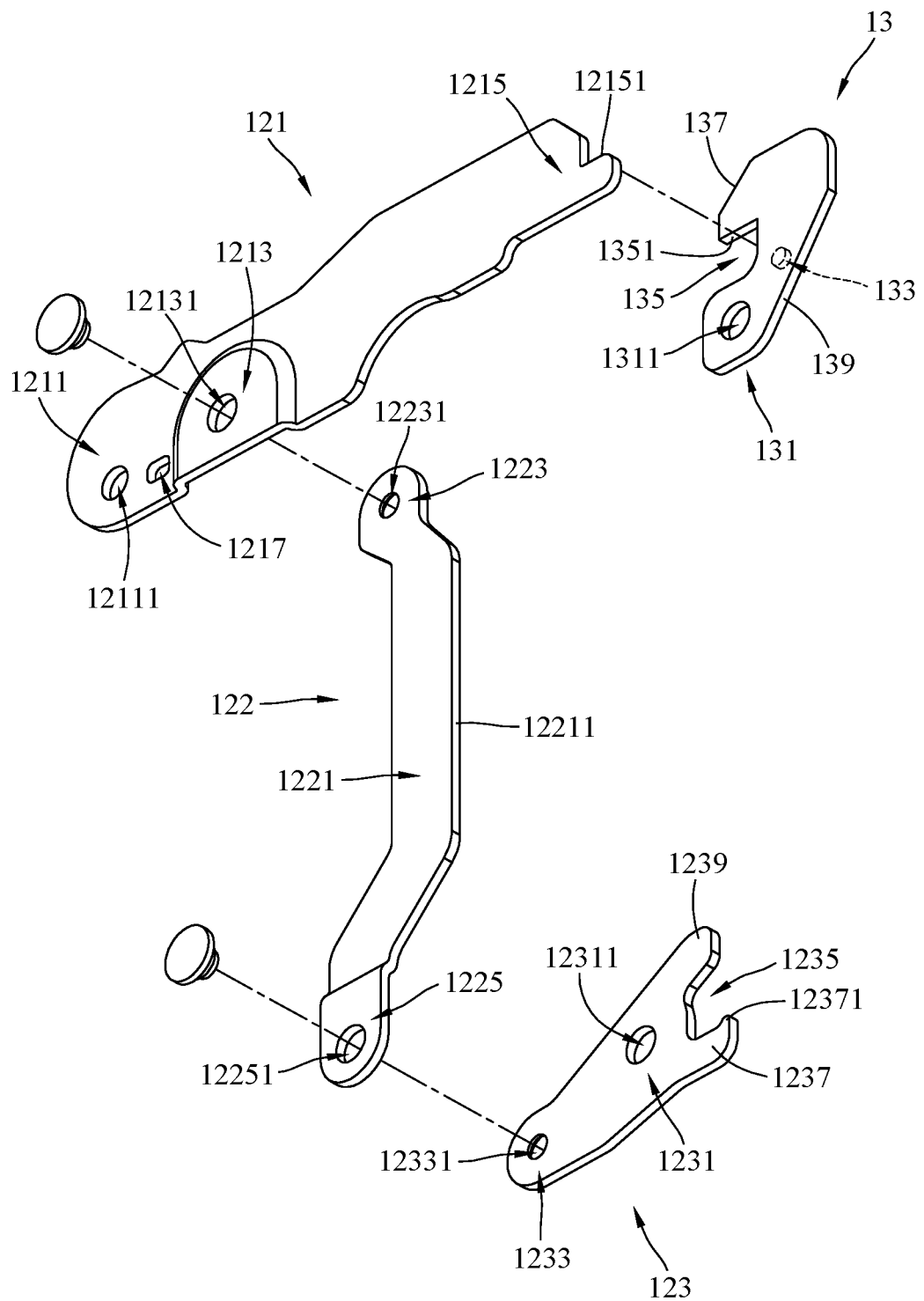
FIG. 6 is an exploded view of a linkage assembly in FIG. 5.

Then, referring to FIGS. 4-5 and further referring to FIG. 6, the details of the cage 11 and the linkage assembly 12 are illustrated, where FIG. 6 is an exploded view of the linkage assembly 12 in FIG. 5.

In this embodiment, the cage assembly 10 further includes a lever holder 13, the linkage assembly 12 includes an actuating lever 121, a link component 122, and a latch 123, and the first plate part 111 of the cage 11 includes an lever installation portion 1110, a first lever stopping portion 1111a, a second lever stopping portion 1111b, a latch installation portion 1112, a latch stopping portion 1113, a link stopping portion 1114, a holder installation portion 1115, a holder guiding portion 1116, a spring installation portion 1118, and a spring stopping portion 1119.

On the cage 11, generally, the lever installation portion 1110 and the holder installation portion 1115 are respectively located adjacent to two opposite ends of the through slot 115 of the cage 11, the first lever stopping portion 1111a and the spring installation portion 1118 are respectively located adjacent to different sides of the lever installation portion 1110, the holder guiding portion 1116 and the spring stopping portion 1119 are respectively located adjacent to different sides of the holder installation portion 1115, the latch installation portion 1112 is located adjacent to the close end of the guide slot 111s1 of the cage 11, and the latch stopping portion 1113 is located adjacent to the top side of the latch installation portion 1112.

In this embodiment, the actuating lever 121, the latch 123, and the lever holder 13 are respectively pivotally connected to different portions of the first plate part 111 of the cage 11.

One end of the actuating lever 121 is movably connected to the lever installation portion 1110 so that the actuating lever 121 is movable at the through slot 115 of the cage 11. Therefore, the actuating lever 121 is substantially movably disposed at a side of the cage 11 that is opposite to the contact portion 11a. The latch 123 is movably connected to the latch installation portion 1112. Therefore, the latch 123 is substantially movably disposed at the side of the cage 11 that has the contact portion 11a. The lever holder 13 is movably connected to the holder installation portion 1115. Therefore, the lever holder 13 is substantially movably disposed at the side of the cage 11 that is opposite to the contact portion 11a. Another end of the actuating lever 121 can be held by the lever holder 13 so as to be detachably fixed to the cage 11 via the lever holder 13. Two opposite ends of the link component 122 are respectively movably connected to the actuating lever 121 and the latch 123.

In more detail, the actuating lever 121 is, for example, made of a single piece, and the actuating lever 121 includes a first linking portion 1211. The first linking portion 1211 is located at one end of the actuating lever 121 and has, for example, a through hole 12111. The lever installation portion 1110 of the first plate part 111 is, for example, a through hole. To install the actuating lever 121, a rivet 71 is disposed through the through hole 12111 on the first linking portion 1211 of the actuating lever 121 and fixed to the lever installation portion 1110 of the first plate part 111, such that the actuating lever 121 is pivotally disposed on the first plate part 111. Therefore, the actuating lever 121 is pivotable relative to the cage 11 and movable at the through slot 115 of the cage 11, such that the actuating lever 121 has a free position (as shown in FIG. 7 illustrated in later paragraphs) and a pressed-down position (as shown in FIG. 12 illustrated in later paragraphs).

The rivet 71 is, for example, but not limited to a step rivet, a screw-on rivet, a screw, the combination thereof or other suitable fasteners that can be used to pivotally connect the actuating lever 121 to the first plate part 111, and the disclosure is not limited thereto. Note that any suitable fastener that can achieve pivotal movement of two objects may be employed. And, to avoid repeated descriptions, the pivotal connection achieved by the rivet or other fasteners will not be repeatedly described hereafter.

The first lever stopping portion 1111a of the first plate part 111 protrudes inward the internal space of the cage assembly 10 from the first plate part 111, and the first lever stopping portion 1111a is located near, for example, one end of the through slot 115 of the cage 11 and is configured to stop the actuating lever 121 at the free position so as to limit the pivotable range of the actuating lever 121. As such, the actuating lever 121 is prevented from being overly pivoted, but the disclosure is not limited to the first lever stopping portion 1111a and the positions of its status. On the other hand, the second lever stopping portion 1111b of the first plate part 111 protrudes from an inner surface of the first plate part 111 facing the linkage assembly 12, and the second lever stopping portion 1111b is located adjacent to, for example, the bottom side of the through slot 115 of the cage 11. The second lever stopping portion 1111b is configured to stop the actuating lever 121 at the pressed-down position so as to prevent the actuating lever 121 from being overly pivoted, but the disclosure is not limited to the second lever stopping portion 1111b and the positions of its status.

In this embodiment, cage assembly 10 further includes a first return spring 141, and the actuating lever 121 further includes a spring installation portion 1217. The first return spring 141 is disposed on the first plate part 111 and located between the first plate part 111 and the actuating lever 121. More specifically, the first return spring 141 is, for example, a torsion spring disposed on the rivet 71, and the first return spring 141 has two free arms (not labeled) respectively fixed to the spring installation portion 1118 of the first plate part 111 and the spring installation portion 1217 of the actuating lever 121. The spring installation portion 1118 has a through hole allowing the insertion of one of the free arms of the first return spring 141, but the disclosure is not limited thereto. The spring installation portion 1217 is, for example, a through hole allowing the insertion of the other free arm of the first return spring 141, but the disclosure is not limited thereto.

During the movement of the actuating lever 121 toward the pressed-down position, the actuating lever 121 and the first plate part 111 deform the first return spring 141 by pressing the free arms of the first return spring 141, such that the first return spring 141 begin to store more elastic potential energy, and the elastic potential energy can be used to spring the actuating lever 121 back to the free position as the actuating lever 121 is released.

Note that the disclosure is not limited to the strength, position, or form of the first return spring 141; for example, in some other embodiments, the first return spring for forcing the actuating lever to move back to the free position may be a compression spring that can constantly apply force on the actuating lever to force it to move toward the free position. In some embodiments, the cage assembly may not have any return spring to return the actuating lever; in such a case, the actuating lever can be moved to the free position or the pressed-down position in a manual manner.

Figure 9:
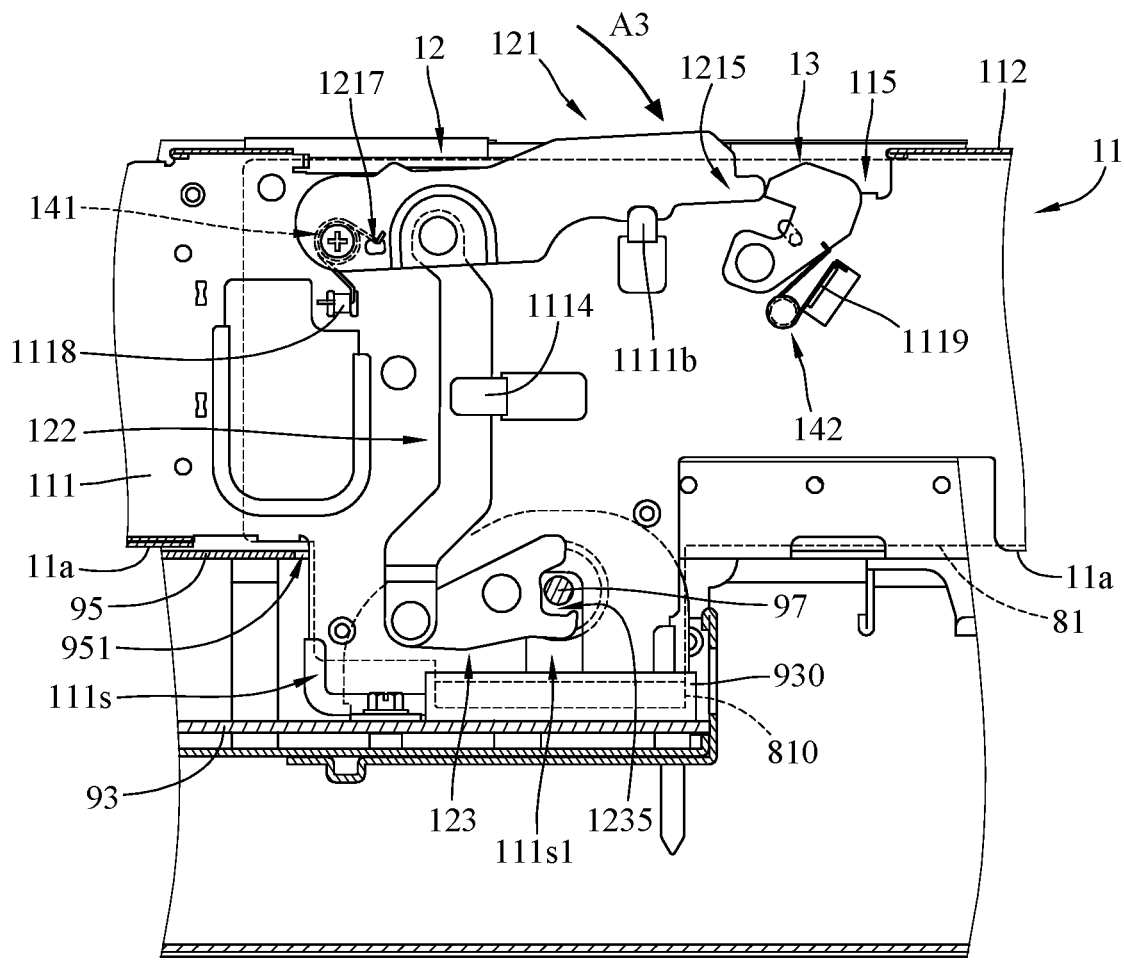

The latch 123 is, for example, made of a single piece, and the latch 123 includes a second linking portion 1231. The second linking portion 1231 is located at the middle portion of the latch 123 and has, for example, a through hole 12311. The latch installation portion 1112 of the first plate part 111 is, for example, a through hole. To install the latch 123, a rivet (not labeled) is disposed through the through hole 12311 on the second linking portion 1231 of the latch 123 and fixed to the through hole on the latch installation portion 1112 of the first plate part 111, such that the latch 123 is pivotally disposed on the first plate part 111. Therefore, the latch 123 is pivotable relative to the cage 11, such that the latch 123 has a disengaged status (as shown in FIG. 7 illustrated in later paragraphs) and an engaged status (as shown in FIG. 9 or 12 illustrated in later paragraphs).

The latch stopping portion 1113 protrudes from a surface of the first plate part 111 facing the linkage assembly 12 and is configured to stop the latch 123 at the engaged status and thus limiting the pivotable range of the latch 123. As such, the latch 123 is prevented from being overly pivoted.

In this embodiment, the aforementioned engaging portion 1235 is located on the latch 123, and the latch 123 further includes a first claw 1237 and a second claw 1239. More specifically, the first claw 1237 and the second claw 1239 are located at the same side of the second linking portion 1231 of the latch 123; in other words, the first claw 1237 and the second claw 1239 are located at a side of the latch 123 opposite to the actuating lever 121. The first claw 1237 and the second claw 1239 are spaced apart from each other so as to form an engaging portion 1235 therebetween, where the engaging portion 1235 may be a recessed portion on a side of the latch 123.

Regarding the relative relationship between the latch 123 and the other components, the first claw 1237 is located closer to the mainboard 93 than the second claw 1239. The engaging portion 1235 is configured to be engaged with the positioning component 97 on the mainboard 93; in other words, the engaging portion 1235 is in a size suitable for accommodating the positioning component 97 of the mainboard 93. Note that the shape and size of the first claw 1237, the second claw 1239, and the engaging portion 1235 formed therebetween are determined by, for example, the interaction between the latch 123 and the positioning component 97, and the disclosure is not limited thereto.

In more detail, in this embodiment, the end of the first claw 1237 of the latch 123 may have a protrusion structure 12371 extending toward the second claw 1239, the protrusion structure 12371 is configured to prevent the positioning component 97 from unexpectedly coming off from the engaging portion 1235, but the disclosure is not limited to the shape or size of the protrusion structure 12371.

In this embodiment, the link component 122 is, for example, made of a single piece, two opposite ends of the link component 122 are respectively pivotally connected to the actuating lever 121 and the latch 123; in other words, the link component 122 is movably connected between the actuating lever 121 and the latch 123. More specifically: the actuating lever 121 further includes a first link installation portion 1213, the first link installation portion 1213 is located closer to the middle portion of the actuating lever 121 than the first linking portion 1211 and has, for example, a through hole 12131; the latch 123 further includes a second link installation portion 1233, the second link installation portion 1233 is located at another side of the second linking portion 1231 opposite to the first claw 1237 and the second claw 1239, and the second link installation portion 1233 has a through hole 12331; the link component 122 includes a lever installation portion 1223 and a latch installation portion 1225, the lever installation portion 1223 is located at one end of the link component 122 and has a through hole 12231, and the latch installation portion 1225 is located at another end of the link component 122 and has a through hole 12251.

To install the link component 122, a rivet (not labeled) is disposed through the through hole 12131 on the first link installation portion 1213 of the actuating lever 121 and the through hole 12231 on the lever installation portion 1223 of the link component 122, such that the link component 122 is pivotally connected to the actuating lever 121; and another rivet (not labeled) is disposed through the through hole 12251 on the latch installation portion 1225 of the link component 122 and the through hole 12331 on the second link installation portion 1233 of the latch 123, such that the link component 122 is pivotally connected to the latch 123.

Therefore, two opposite ends of the link component 122 are respectively pivotally fixed to the actuating lever 121 and the latch 123, such that the motion of the actuating lever 121 can be transferred to the latch 123 via the link component 122 so as to switch the status of the latch 123. In this embodiment, during the movement of the actuating lever 121 to the free position, the actuating lever 121 moves the link component 122 so as to cause the latch 123 to pivot to the disengaged status; on the contrary, during the movement of the actuating lever 121 to the pressed-down position, the actuating lever 121 moves the link component 122 so as to cause the latch 123 to pivot to the engaged status. The detail descriptions of such operations will be described in the later paragraphs.

In addition, in this embodiment, the link component 122 further includes a link main body 1221 connected to and located between the lever installation portion 1223 and the latch installation portion 1225, the link main body 1221 has a contact surface 12211. The contact surface 12211 is configured to contact the link stopping portion 1114 of the first plate part 111, such that the link stopping portion 1114 is able to limit the motion range of the link component 122 relative to the actuating lever 121.

Figure 10:
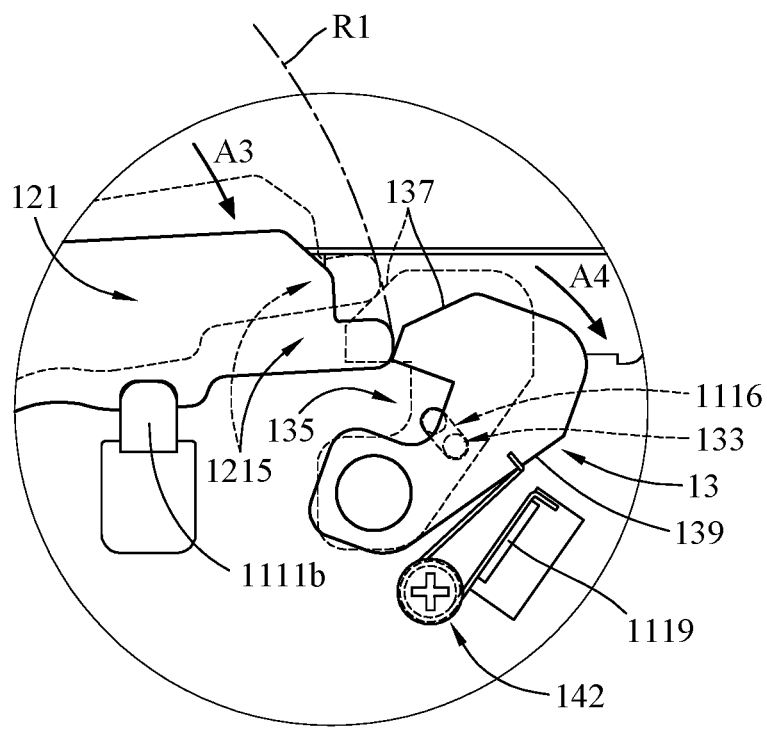

In this embodiment, the lever holder 13 is, for example, made of a single piece, and the lever holder 13 includes a third linking portion 131. The third linking portion 131 is located at one end of the lever holder 13 and has, for example, a through hole 1311; the holder installation portion 1115 of the first plate part 111 is, for example, a through hole. To install the lever holder 13, a rivet (not shown) is disposed through the through hole 1311 on the third linking portion 131 of the lever holder 13 and the holder installation portion 1115 on the first plate part 111, such that the lever holder 13 is pivotally disposed on the first plate part 111. Therefore, the lever holder 13 is pivotably located at the other end of the through slot 115 of the cage 11 and has a lever-holding position (as shown in FIG. 7 or 12 illustrated in later paragraphs) and a lever-releasing position (as shown in FIG. 10 illustrated in later paragraphs).

In more detail, the lever holder 13 further includes a follower post 133, and the follower post 133 protrudes from a surface of the lever holder 13 facing the first plate part 111. The holder guiding portion 1116 of the first plate part 111 is, for example, a guide slot. The follower post 133 of the lever holder 13 is movably located in the holder guiding portion 1116 of the first plate part 111, such that the pivotable range of the lever holder 13 is limited.

In addition, in this embodiment, the actuating lever 121 further includes an engagement portion 1215, the lever holder 13 further includes a lever holding portion 135, a contact bevel 137, and a press surface 139, and the cage assembly 10 further includes a second return spring 142. The engagement portion 1215 is located at the end of the actuating lever 121 opposite to the first linking portion 1211. The lever holding portion 135 may be a recess facing the actuating lever 121 when the lever holder 13 is in the lever-holding position, and the lever holding portion 135 is in a size suitable for accommodating at least part of the engagement portion 1215 of the actuating lever 121. The contact bevel 137 is a sloping surface located in the movable range of the engagement portion 1215 of the actuating lever 121 when the lever holder 13 is in the lever-holding position. The press surface 139 is another sloping surface of the lever holder 13 opposite to the contact bevel 137. The second return spring 142 is disposed on the first plate part 111 and located adjacent to the press surface 139 of the lever holder 13.

More specifically, the second return spring 142 is, for example, a torsion spring, and the second return spring 142 has two free arms (not labeled) respectively press against the press surface 139 of the lever holder 13 and the spring stopping portion 1119 on the first plate part 111. During the movement of the lever holder 13 to the lever-releasing position, the press surface 139 of the lever holder 13 and the spring stopping portion 1119 of the first plate part 111 deform the second return spring 142 by pushing its free arms, such that the second return spring 142 begins to store more elastic potential energy, and the elastic potential energy can be used to spring the lever holder 13 back to the lever-holding position as the lever holder 13 is released.

Therefore, during the movement of the actuating lever 121 from the free position to the pressed-down position, the engagement portion 1215 of the actuating lever 121 pushes the contact bevel 137 of the lever holder 13 so as to force the lever holder 13 to pivot toward the lever-releasing position. When the actuating lever 121 is moved further toward the pressed-down position to make the engagement portion 1215 go across the contact bevel 137 of the lever holder 13, the second return spring 142 can forces the lever holder 13 to return to the lever-holding position and thus causing the lever holding portion 135 of the lever holder 13 to engage with the engagement portion 1215 of the actuating lever 121, at this moment, the lever holder 13 holds the actuating lever 121 in the pressed-down position.

In more detail, the engagement portion 1215 of the actuating lever 121 has a contact surface 12151, and the lever holding portion 135 of the lever holder 13 has a contact surface 1351. The contact surface 12151 of the engagement portion 1215 contacts and presses against the contact surface 1351 of the lever holding portion 135 when the actuating lever 121 is in the pressed-down position.

Note that the disclosure is not limited to the strength, position, or form of the second return spring 142; for example, in some other embodiments, the second return spring for forcing the lever holder to move back to the lever-holding position may be a compression spring that can constantly apply force on the lever holder to force it to move toward the lever-holding position. In some embodiments, the cage assembly may not have any return spring for returning the lever holder; in such a case, the lever holder can be moved to the lever-releasing position or the lever-holding position in a manual manner.

Then, the operation and installation of the cage assembly 10 are described in detail in the following paragraphs. Referring to FIGS. 7-12, the installation processes of the cage assembly 10 are provided. For the purpose of illustration, the drawings of the installation processes are illustrated in a partially enlarged manner, and the adapter card 81 and the GPU 83 of the function expansion assembly 8 may be drawn in dotted line or omitted from the drawings.

Firstly, as shown in FIG. 7, before the installation, the linkage assembly 12 of the cage assembly 10 is kept in the detached status; that is, the actuating lever 121 of the linkage assembly 12 is kept in the free position by the first return spring 141. At this moment, the first lever stopping portion 1111a stops the actuating lever 121 at the free position, such that the latch 123 is kept in the disengaged status via the actuating lever 121 and the link component 122, and the lever holder 13 is kept in the lever-holding position by the second return spring 142.

Figure 8:
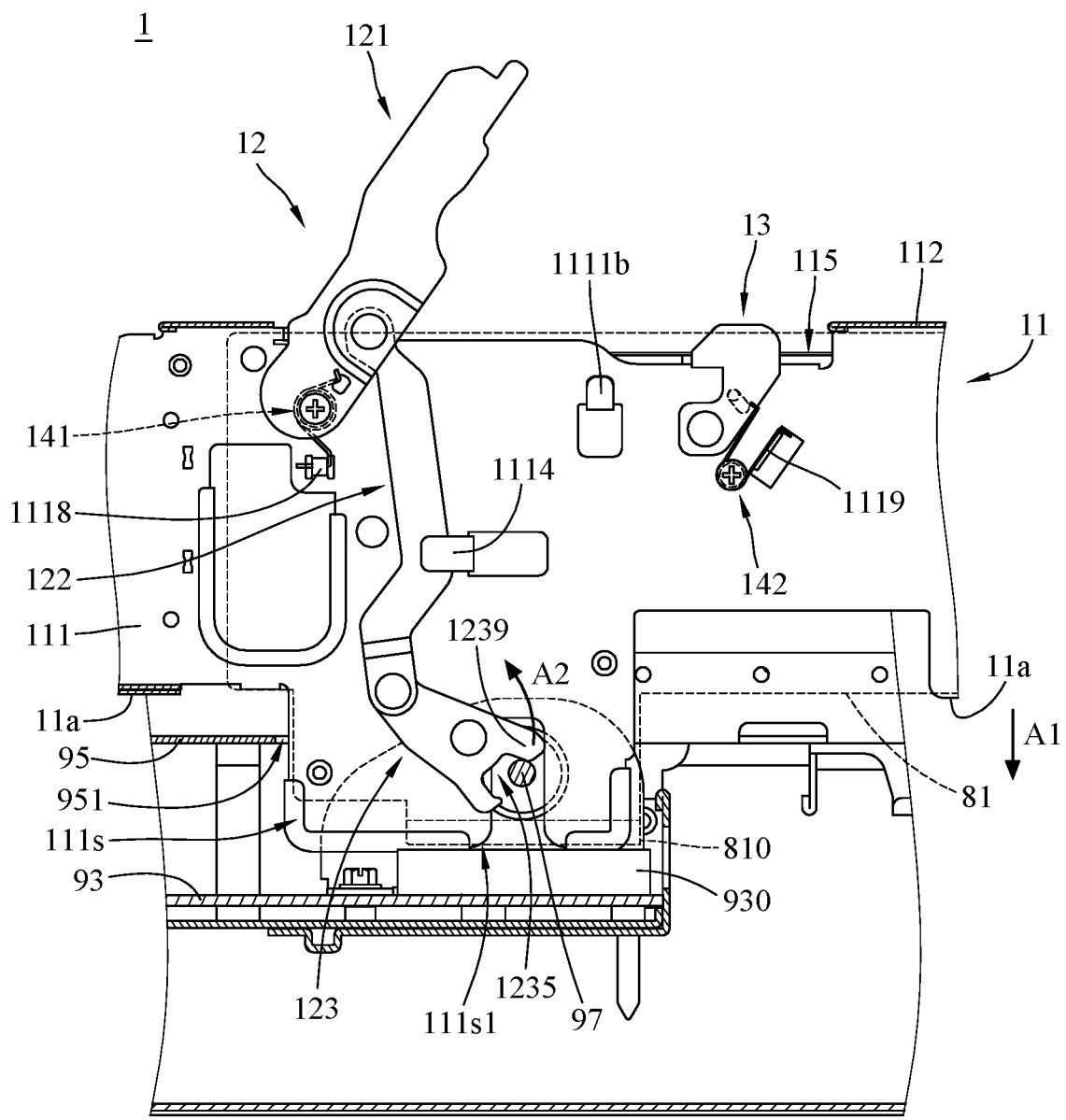

Then, as shown in FIGS. 8-9, the cage assembly 10 is being placed on the tray 95 in a direction indicated by the arrow A1. During the placement of the cage assembly 10, the contact portion 11a of the cage 11 of the cage assembly 10 can rest on the tray 95, the guide portion 111s of the first plate part 111 of the cage 11 is disposed through the through hole 951 on the tray 95, and the positioning component 97 on the mainboard 93 enters into and slides along the guide slot 111s1 in, for example, a direction opposite to the arrow A1 and then enters into the engaging portion 1235 of the latch 123 and touches the second claw 1239 of the latch 123 of the linkage assembly 12.

As the cage assembly 10 moves further toward the tray 95 along the direction indicated by the arrow A1, the positioning component 97 on the mainboard 93 pushes the second claw 1239 of the latch 123 and forces it to move upward, and thus forcing the latch 123 to pivot to the engaged status from the disengaged status (as indicated by arrow A2). And the pivoting movement of the latch 123 can move the link component 122 so as to force the actuating lever 121 to move to the pressed-down position from the free position (as indicated by arrow A3). As shown in FIGS. 8 and 9, the actuating lever 121 and the latch 123 are pivoted in opposite directions (i.e., the directions indicated by arrows A2 and A3). In addition, during the movement of the actuating lever 121 to the pressed-down position, the actuating lever 121 deforms the first return spring 141 so that the first return spring 141 stores elastic potential energy.

Note that a suitable external force or the weight of the cage assembly 10 both can achieve the movement of the cage assembly 10 in the direction indicated by the arrow A1, but the disclosure is not limited thereto. In addition, when the cage assembly 10 moves toward the tray 95, the positioning component 97 will touch and push the second claw 1239 of the latch 123 so as to let the user to know whether the cage assembly 10 is being placed in the desired manner.

Then, as shown in FIGS. 9-10, the actuating lever 121 is pivoted to the pressed-down position from the free position by being driven by the latch 123, and the actuating lever 121 passes through the through slot 115 of the cage 11 and enters into the internal space between the first plate part 111 and the second plate part 112. Meanwhile, during the movement of the actuating lever 121 to the pressed-down position, since the contact bevel 137 of the lever holder 13 is at a motion path R1 of the engagement portion 1215 of the actuating lever 121, the engagement portion 1215 of the actuating lever 121 will contact the contact bevel 137 of the lever holder 13 and force the lever holder 13 to pivot toward the lever-releasing position (e.g., along the direction indicated by arrow A4).

Figure 11:
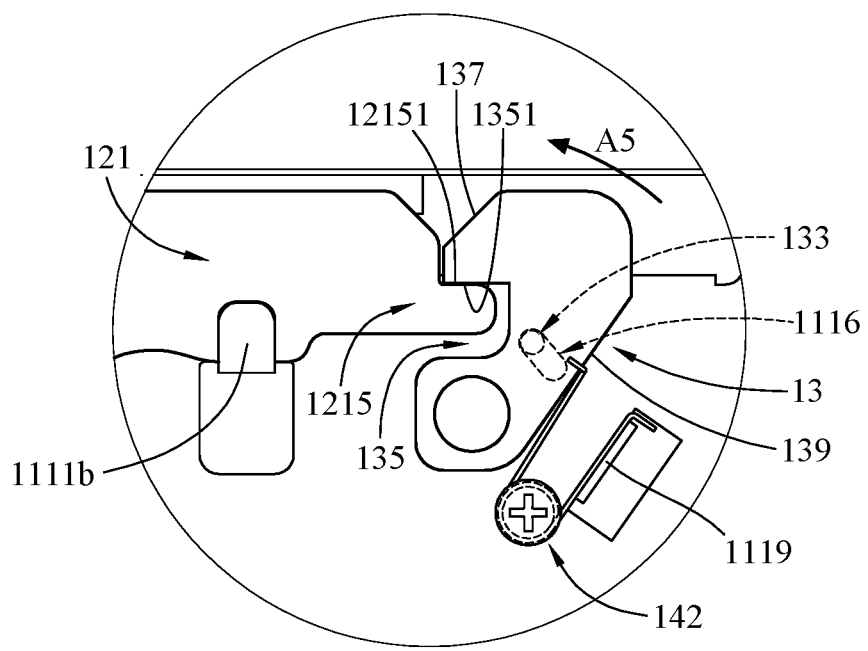

Then, as shown in FIG. 11, when the actuating lever 121 keeps moving toward the pressed-down position to let the engagement portion 1215 to slide across the contact bevel 137 of the lever holder 13, then the second return spring 142 springs the lever holder 13 back to the lever-holding position (e.g., along the direction indicated by arrow A5), such that the lever holding portion 135 of the lever holder 13 is engaged with the engagement portion 1215 of the actuating lever 121 and thus securing the actuating lever 121 in the pressed-down position.

In addition, when the actuating lever 121 reaches the pressed-down position, the second lever stopping portion hub stops the actuating lever 121 at the pressed-down position, and the follower post 133 of the lever holder 13 is movably located in the holder guiding portion 1116 of the first plate part 111 so that the lever holder 13 is moved to the lever-releasing position or the lever-holding position in a limited pivotable range. Meanwhile, the actuating lever 121 and the lever holder 13 respectively experience the force applied by the first return spring 141 and the second return spring 142, such that the contact surface 12151 of the engagement portion 1215 of the actuating lever 121 is kept in contact with the contact surface 1351 of the lever holding portion 135 of the lever holder 13.

Lastly, as shown in FIG. 12, the actuating lever 121 is fixed in the pressed-down position by the lever holder 13, thus the latch 123 is fixed in the engaged status. As a result, the linkage assembly 12 is stably fixed in the installed status, such that the engaging portion 1235 of the linkage assembly 12 is firmly engaged with the positioning component 97.

In addition, the protrusion structure 12371 at the end of the first claw 1237 of the latch 123 is able to hook on the positioning component 97 so as to secure the engagement between the latch 123 and the positioning component 97. In such a case, when an external force along a direction away from the mainboard 93 is applied on the cage assembly 10, the latch 123 is still firmly kept in the engaged status and the engaging portion 1235 is still engaged with the positioning component 97.

To the function expansion assembly 8, while the cage assembly 10 is being placed onto the tray 95 to cause the linkage assembly 12 to be switched to the installed status, the gold fingers 810 of the adapter card 81 of the function expansion assembly 8 is plugged into the edge connector 930 of the mainboard 93, and the relative positions of the cage assembly 10 and the mainboard 93 are secured by the engagement between the linkage assembly 12 and the positioning component 97, ensuring the electrical connection between the gold fingers 810 and the edge connector 930 and reducing the impact on the tray 95 due to external force. As such, the electrical connection between the GPU 83 and the mainboard 93 is secured. Regarding the internal space of the chassis 91, the function expansion assembly 8 in the upper area L2 can be fixed to the mainboard 93 in the lower area L1 by the cage assembly 10, thus the electrical connection between the function expansion assembly 8 and the mainboard 93 will not be affected by the tray 95.

As discussed, the installation of the cage assembly 10 is easy and simple and can be completed by one hand without using any additional hand tool. For example, the user is able to carry the cage assembly 10 and place it on the tray 95 with one hand, and then the weight of the cage assembly 10 and the function expansion assembly 8 may be sufficient to force the linkage assembly 12 to switch to the installed status and automatically engage with the positioning component 97.

On the other hand, the detachment of the cage assembly 10 can be completed by reversing the previous installation steps: the actuating lever 121 of the linkage assembly 12 and the lever holder 13 are exposed from the through slot 115 of the cage 11, such that the user is able to pivot the lever holder 13 to the lever-releasing position with one finger through the through slot 115, and then the engagement portion 1215 of the actuating lever 121 is released from the lever holding portion 135 of the lever holder 13, by doing so, the elastic potential energy stored in the first return spring 141 is released to spring the actuating lever 121 back to the free position, and the second return spring 142 returns the lever holder 13 back to the lever-holding position. And the movement of the actuating lever 121 will move the link component 122 so as to force the latch 123 to pivot to the disengaged status, such that the engaging portion 1235 is disengaged from the positioning component 97 on the mainboard 93. Then, the linkage assembly 12 returns to the detached status, and the cage assembly 10 and the function expansion assembly 8 thereon are allowed to be removed from the mainboard 93. It is understood that the detachment of the cage assembly 10 can be completed by one hand without using any additional hand tool.

In short, the installation of the cage assembly 10 can be completed by simply placing the cage assembly 10 to the tray 95, and the detachment of the cage assembly 10 can be completed by simply releasing the lever holder 13, thus the operation of the cage assembly 10 can be performed by one hand without using any additional hand tool. In addition, the linkage assembly 12 of the cage assembly 10 can be automatically returned to its free position by the first return spring 141 and the second return spring 142, thus the operation of the cage assembly 10 is convenient and easy-to-use and can be performed in a less effort manner.

In addition, in some applications that the function expansion assembly 8 accommodates more of the GPUs 83, the weight of the cage assembly 10 and the function expansion assembly 8 increases, but the cage assembly 10 is still able to stably fix the function expansion assembly 8 in the desired position and the electrical connection of the function expansion assembly 8 will not be affected by vibration, sudden impact, or the movement of the tray 95. In some other applications that the function expansion assembly 8 accommodates the GPUs 83 in a number of its maximum limit, the cage assembly 10 is still able to ensure the position of the function expansion assembly 8 and prevent the function expansion assembly 8 from being accidentally released.

However, the disclosure is not limited to the design of the cage assembly 10 in the previous embodiments. For example, in some other embodiments, the cage assembly may omit the lever holder, in such a case, the end of the actuating lever may have a movable hooking structure that can be directly engaged with the cage.

In addition, any means that can be connected between the actuating lever and the latch and transfer one's motion to the other shall be employed as the link component of the disclosure. For example, in some embodiments, the link component 122 of the cage assembly 10 can be replaced with one or a group of gears connected between the actuating lever and the latch; in such a case, the linkage assembly at least includes more than three components. However, the disclosure is not limited thereto. For example, in some other embodiments, the linkage assembly may not have the link component, and the actuating lever and the latch may be modified to be directly connected to each other.

In addition, in the previous embodiments, the actuating lever 121, the link component 122, the latch 123, and the lever holder 13 are pivotally disposed on the cage 11, but the disclosure is not limited thereto. For example, in some embodiments, the actuating lever, the link component, the latch, and the lever holder may be slidably disposed on the sliding slots on the cage, such that the actuating lever, the link component, the latch, and the lever holder may be moved in a slidable manner.

According to the cage assembly and the electronic device discussed in the previous embodiments, the linkage assembly of the cage assembly has the actuating lever disposed on the cage, the actuating lever and the contact portion are respectively located at two opposite sides of the cage, and the latch connected to the actuating lever has the engaging portion configured to be engaged with the positioning component, thus the user is allowed to operate the actuating lever from one side of the cage to cause the engaging portion at the other side of the cage to move relative to the positioning component. Therefore, in one application that the cage assembly is disposed on a tray of a server, the engaging portion of the linkage assembly is able to extend to the bottom side of the cage or even extend to the positioning component on the mainboard and under the tray so as to engage with the positioning component. As such, the position of the cage assembly relative to the mainboard is secured and will not be affected by vibration, sudden impact, or the movement of the tray. As a result, the electrical connection between the function expansion assembly in the cage assembly and the mainboard is secured, avoiding the problem that the conventional functional module is easily released from its predetermined position due to external force.

In addition, the installation of the cage assembly is easy and simple and can be completed by simply placing the cage assembly on the tray with one hand without using any additional hand tool.

In some embodiments, the cage assembly further has the lever holder for keeping the linkage assembly in the installed status, such that the engagement between the engaging portion and the positioning component is secured, reducing the impact on the electrical connection between the function expansion assembly and the mainboard due to the movement or vibration of the tray.

In addition, in some embodiments, the cage assembly has one or more return springs to return the linkage assembly to its free position so that the operation of the cage assembly is convenient and can be performed in a less effort manner. In the embodiment that the lever holder incorporates with a return spring, the user is able to pivot the lever holder to let the linkage assembly to return to the detached status. Therefore, the detachment of the cage assembly can also be performed by one hand without using any additional hand tool.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An electronic device, comprising:
    a chassis;
    a mainboard, disposed on the chassis;
    a tray, disposed on the chassis and spaced apart from the mainboard;
    a positioning component, fixed to the mainboard; and
    a cage assembly, comprising:
        a cage, configured to be disposed on the tray, and the cage having a guide slot that is located at a bottom side thereof and configured for guiding the positioning component; and
        a linkage assembly, comprising a link component, an actuating lever and a latch, wherein the latch is connected to the actuating lever and has an engaging portion, and the engaging portion of the latch is movable next to the guide slot so as to be engageable with the positioning component,
        wherein the actuating lever comprises a first linking portion, a first link installation portion, and an engagement portion, the first link installation portion is connected to and located between the first linking portion and the engagement portion, the first linking portion is movably connected to the cage, the engagement portion is removably fixed on the cage, the latch further comprises a second linking portion and a second link installation portion, the second linking portion is movably connected to the cage, and the second linking portion is connected to and located between the second link installation portion and the engaging portion, two opposite ends of the link component are respectively movably connected to the first link installation portion of the actuating lever and the second link installation portion of the latch, and the actuating lever and the latch are movable in opposite directions.

2. The electronic device according to claim 1, wherein the tray has a through hole, and the linkage assembly is movably disposed through the through hole of the tray.

3. The electronic device according to claim 2, wherein the engaging portion of the linkage assembly and the guide slot of the cage are respectively located at two opposite sides of the tray.

4. The electronic device according to claim 1, wherein the cage assembly further comprises a first return spring compressed by a spring installation portion of the cage and the actuating lever, the actuating lever has a free position and a pressed-down position; when the engagement portion of the actuating lever is fixed on the cage, the actuating lever is in the pressed-down position and deforms the first return spring; when the engagement portion of the actuating lever is released from the cage, the first return spring forces the actuating lever to move toward the free position.

5. The electronic device according to claim 4, wherein the cage assembly further comprises a second return spring and a lever holder, the lever holder is movably disposed on the cage and has a lever-holding position and a lever-releasing position, the second return spring is compressed by a spring stopping portion and the lever holder so as to store elastic potential energy for returning the lever holder to the lever-holding position; when the actuating lever is in the pressed-down position and the lever holder is in the lever-holding position, the engagement portion of the actuating lever is engaged with the lever holder; when the lever holder is moved to the lever-releasing position from the lever-holding position, the first return spring forces the actuating lever to move toward the free position so as to disengage the engagement portion of the actuating lever from the lever holder.

6. The electronic device according to claim 5, wherein the lever holder comprises a contact bevel configured to contact the engagement portion of the actuating lever.

7. The electronic device according to claim 1, wherein the latch further comprises a first claw and a second claw, the first claw and the second claw are located at a same side of the latch, and the first claw and the second claw form the engaging portion therebetween.

8. The electronic device according to claim 7, wherein the first claw is located closer to the mainboard than the second claw, the first claw has a protrusion structure located at one end thereof, and the protrusion structure extends toward the second claw.

9. A cage assembly, comprising:
    a cage, having a guide slot that is located at a bottom side thereof and configured for guiding a positioning component; and
    a linkage assembly, comprising a link component, an actuating lever and a latch, wherein the latch is connected to the actuating lever and has an engaging portion, and the engaging portion of the latch is movable next to the guide slot so as to be engageable with the positioning component,
    wherein the actuating lever comprises a first linking portion, a first link installation portion, and an engagement portion, the first link installation portion is connected to and located between the first linking portion and the engagement portion, the first linking portion is movably connected to the cage, the engagement portion is removably fixed on the cage, the latch further comprises a second linking portion and a second link installation portion, the second linking portion is movably connected to the cage, and the second linking portion is connected to and located between the second link installation portion and the engaging portion, two opposite ends of the link component are respectively movably connected to the first link installation portion of the actuating lever and the second link installation portion of the latch, and the actuating lever and the latch are movable in opposite directions.

10. The cage assembly according to claim 9, further comprising a first return spring compressed by a spring installation portion of the cage and the actuating lever, the actuating lever has a free position and a pressed-down position; when the engagement portion of the actuating lever is fixed on the cage, the actuating lever is in the pressed-down position and deforms the first return spring; when the engagement portion of the actuating lever is released from the cage, the first return spring forces the actuating lever to move toward the free position.

11. The cage assembly according to claim 10, further comprising a second return spring and a lever holder, wherein the lever holder is movably disposed on the cage and has a lever-holding position and a lever-releasing position, the second return spring is compressed by a spring stopping portion and the lever holder so as to store elastic potential energy for returning the lever holder to the lever-holding position; when the actuating lever is in the pressed-down position and the lever holder is in the lever-holding position, the engagement portion of the actuating lever is engaged with the lever holder; when the lever holder is moved to the lever-releasing position from the lever-holding position, the first return spring forces the actuating lever to move toward the free position so as to disengage the engagement portion of the actuating lever from the lever holder.

12. The cage assembly according to claim 11, wherein the lever holder comprises a contact bevel configured to contact the engagement portion of the actuating lever.

13. The cage assembly according to claim 9, wherein the latch further comprises a first claw and a second claw, the first claw and the second claw are located at a same side of the latch, and the first claw and the second claw form the engaging portion therebetween.

14. The cage assembly according to claim 13, wherein the first claw has a protrusion structure located at one end thereof, and the protrusion structure extends toward the second claw.

* * * * *